(12) United States Patent
Sakisaka et al.

(10) Patent No.: US 7,982,557 B2
(45) Date of Patent: Jul. 19, 2011

(54) LAYERED LOW-PASS FILTER CAPABLE OF PRODUCING A PLURALITY OF ATTENUATION POLES

(75) Inventors: Yasunori Sakisaka, Tokyo (JP); Yukitoshi Kagaya, Tokyo (JP)

(73) Assignee: TDK Corporation, Tokyo (JP)

( * ) Notice: Subject to any disclaimer, the term of this patent is extended or adjusted under 35 U.S.C. 154(b) by 247 days.

(21) Appl. No.: 12/318,786

(22) Filed: Jan. 8, 2009

(65) Prior Publication Data

US 2009/0189714 A1   Jul. 30, 2009

(30) Foreign Application Priority Data

Jan. 29, 2008   (JP) ................................ 2008-017075

(51) Int. Cl.
*H03H 7/00*   (2006.01)
(52) U.S. Cl. ........................................ 333/185; 333/177
(58) Field of Classification Search .................. 333/177, 333/184, 185, 202, 204, 205
See application file for complete search history.

(56) References Cited

U.S. PATENT DOCUMENTS

| | | | |
|---|---|---|---|
| 5,304,967 A | 4/1994 | Hayashi | |
| 5,357,227 A | 10/1994 | Tonegawa et al. | |

FOREIGN PATENT DOCUMENTS

| | | |
|---|---|---|
| JP | Y2-3-32081 | 7/1991 |
| JP | A-4-355902 | 12/1992 |
| JP | B2-5-63974 | 9/1993 |
| JP | A-05-259703 | 10/1993 |
| JP | A-05-299962 | 11/1993 |
| JP | A-6-97701 | 4/1994 |
| JP | A-06-188608 | 7/1994 |
| JP | A-2000-101378 | 4/2000 |
| JP | A-2006-165830 | 6/2006 |

OTHER PUBLICATIONS

Feb. 2, 2010 Office Action issued in Japanese Patent Application No. 2008-017075 (with translation).

*Primary Examiner* — Robert Pascal
*Assistant Examiner* — Kimberly E Glenn
(74) *Attorney, Agent, or Firm* — Oliff & Berridge PLC

(57) ABSTRACT

A layered low-pass filter includes: a first inductor and a second inductor that are connected in series and are located between an input terminal and an output terminal; a first capacitor connected in parallel to the first inductor; a second capacitor connected in parallel to the second inductor; and third to fifth capacitors and third to fifth inductors. The output of the first inductor and the input of the second inductor are connected to the ground via the third capacitor and the third inductor connected in series. The input of the first inductor is connected to the ground via the fourth capacitor and the fourth inductor connected in series. The output of the second inductor is connected to the ground via the fifth capacitor and the fifth inductor 8 connected in series.

1 Claim, 9 Drawing Sheets

LAYERED LOW-PASS FILTER CAPABLE OF PRODUCING A PLURALITY OF ATTENUATION POLES

BACKGROUND OF THE INVENTION

1. Field of the Invention

The present invention relates to a layered low-pass filter formed using a layered substrate.

2. Description of the Related Art

Recently, there have been strong demands for reductions in size and thickness of electronic apparatuses for portable use typified by cellular phones and notebook personal computers, and accordingly, reductions in size and thickness have also been required for electronic components for use in such electronic apparatuses. Low-pass filters are one of the electronic components for use in such electronic apparatuses. Reductions in size and thickness are also required for low-pass filters. To meet this, it has been proposed to form a low-pass filter using a layered substrate, as disclosed in, for example, JP-A-5-259703, JP-A-5-299962, JP-A-6-097701 and JP-A-2000-101378. A low-pass filter formed using a layered substrate as mentioned above will be hereinafter called a layered low-pass filter.

To obtain a steep attenuation characteristic with a low-pass filter, the low-pass filter should preferably be of the fifth order or higher. A fifth-order low-pass filter includes, for example, a first inductor and a second inductor connected in series to each other, a first capacitor provided between the ground and the node between the two inductors, a second capacitor provided between the ground and an end of the first inductor opposite to the node, and a third capacitor provided between the ground and an end of the second inductor opposite to the node.

Inverse Chebyshev low-pass filters and elliptic (simultaneous Chebyshev) low-pass filters are known as being capable of providing a steeper attenuation characteristic. The inverse Chebyshev low-pass filters and the elliptic low-pass filters present at least one attenuation pole in the stop band.

For a signal path in which a low-pass filter is used, there are cases where it is required to increase attenuation especially in a plurality of specific narrow frequency bands present in the stop band of the low-pass filter. An example of such cases is a case where, in a communication apparatus operable on a plurality of communication systems that use different frequency bands, a low-pass filter for allowing signals in the lowest frequency band to pass and intercepting signals in the other frequency bands is used in the path of a reception signal of one of the communication systems that uses the lowest frequency band. In such a case, in the reception signal path in which the low-pass filter is used, it may be required to increase attenuation especially in the other frequency bands present in the stop band of the low-pass filter.

In the case where it is required to increase attenuation especially in a plurality of specific narrow frequency bands present in the stop band of a low-pass filter in the signal path in which the low-pass filter is used as described above, a plurality of notch filters for increasing attenuation in the specific narrow frequency bands may be provided in series to the low-pass filter. Disadvantageously, however, this leads to an increase in insertion loss in the pass band of the low-pass filter.

JP-A-5-259703 discloses a technique of adjusting the frequency of the attenuation pole closest to the pass band by adjusting the inductance generated in an external electrode portion through changing the length of the external electrode. However, in the case where it is required to increase attenuation especially in a plurality of specific narrow frequency bands present in the stop band of a low-pass filter in the signal path in which the low-pass filter is used, the plurality of specific narrow frequency bands are typically present within a range from the frequency at which the attenuation pole closest to the pass band appears to a frequency on the order of several times higher than the cut-off frequency. In such a case, it is difficult to increase attenuation especially in the plurality of specific narrow frequency bands present in the stop band by utilizing the attenuation pole closest to the pass band.

OBJECT AND SUMMARY OF THE INVENTION

It is an object of the present invention to provide a layered low-pass filter that allows an increase in attenuation especially in a plurality of specific narrow frequency bands present in the stop band of the low-pass filter.

A layered low-pass filter of the present invention includes: a layered substrate including a plurality of dielectric layers stacked; an input terminal and an output terminal each disposed on a periphery of the layered substrate; a first inductor and a second inductor each formed using at least one conductor layer provided within the layered substrate, the first and second inductors being connected in series to each other and, in terms of circuit configuration, located between the input terminal and the output terminal; and first to fifth capacitors and third to fifth inductors provided within the layered substrate.

In the layered low-pass filter of the present invention, in terms of circuit configuration, the first inductor is located closer to the input terminal than is the second inductor. Each of the first and second inductors has an input for receiving signals and an output for outputting signals. The output of the first inductor is connected to the input of the second inductor. The first capacitor is connected in parallel to the first inductor, and the second capacitor is connected in parallel to the second inductor. The third capacitor has a first end connected to the output of the first inductor and to the input of the second inductor. The fourth capacitor has a first end connected to the input of the first inductor. The fifth capacitor has a first end connected to the output of the second inductor. The third inductor connects a second end of the third capacitor to the ground. The fourth inductor connects a second end of the fourth capacitor to the ground. The fifth inductor connects a second end of the fifth capacitor to the ground.

According to the layered low-pass filter of the present invention, first to fourth attenuation poles appear in the stop band. Each of the second to fourth attenuation poles appears at a frequency higher than that at which the first attenuation pole appears. The frequencies at which the second to fourth attenuation poles appear depend on the inductances of the third to fifth inductors, respectively.

The layered low-pass filter of the present invention may further include first to third grounding terminals each disposed on the periphery of the layered substrate and connected to the ground. Each of the third to fifth capacitors may include a capacitor-forming conductor layer and a ground-side conductor layer that are opposed to each other. In this case, the third inductor connects the ground-side conductor layer of the third capacitor to the first grounding terminal, the fourth inductor connects the ground-side conductor layer of the fourth capacitor to the second grounding terminal, and the fifth inductor connects the ground-side conductor layer of the fifth capacitor to the third grounding terminal. The ground-side conductor layers of the third to fifth capacitors may be disposed on a surface of one of the dielectric layers, and the third to fifth inductors may be disposed on a surface of another one of the dielectric layers.

The layered low-pass filter of the present invention is capable of exhibiting first to fourth attenuation poles in the stop band. Consequently, according to the present invention, it is possible to increase attenuation especially in a plurality of specific narrow frequency bands present in the stop band of the low-pass filter by utilizing the first to fourth attenuation poles.

Other and further objects, features and advantages of the invention will appear more fully from the following description.

DESCRIPTION OF THE PREFERRED EMBODIMENT

Figure 3:
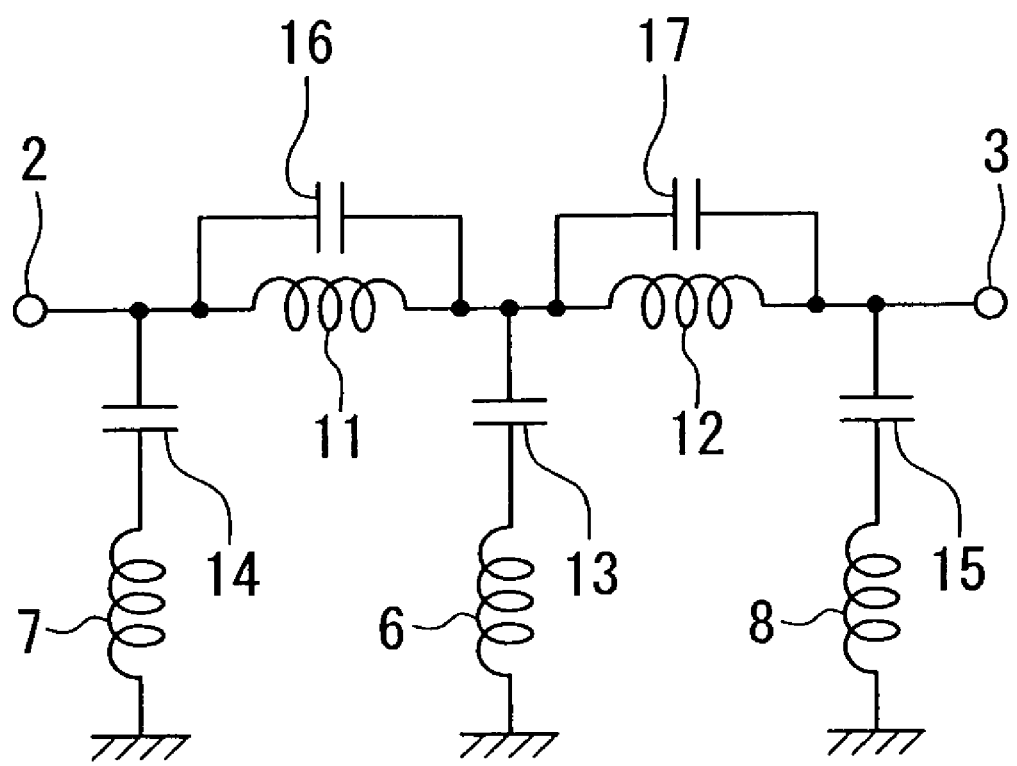
FIG. 3 is a circuit diagram illustrating the circuit configuration of the layered low-pass filter according to the embodiment of the invention.

A preferred embodiment of the present invention will now be described in detail with reference to the drawings. Reference is first made to FIG. 3 to describe the circuit configuration of a layered low-pass filter according to the preferred embodiment of the invention. As illustrated in FIG. 3, the layered low-pass filter 1 according to the embodiment includes: an input terminal 2 for receiving signals; an output terminal 3 for outputting signals; five inductors 6, 7, 8, 11 and 12; and five capacitors 13 to 17.

The inductors 11 and 12 are connected in series to each other and, in terms of circuit configuration, located between the input terminal 2 and the output terminal 3. In terms of circuit configuration, the inductor 11 is located closer to the input terminal 2 than is the inductor 12. The inductor 11 corresponds to the first inductor of the present invention, and the inductor 12 corresponds to the second inductor of the present invention. Each of the inductors 11 and 12 has an input for receiving signals and an output for outputting signals. The input of the inductor 11 is connected to the input terminal 2. The output of the inductor 11 is connected to the input of the inductor 12. The output of the inductor 12 is connected to the output terminal 3. It should be noted that the phrase "in terms of circuit configuration" used herein is intended to mean positioning in a schematic circuit diagram, not in the physical configuration.

The capacitor 16 is connected in parallel to the inductor 11. The capacitor 17 is connected in parallel to the inductor 12. The capacitor 16 corresponds to the first capacitor of the present invention, and the capacitor 17 corresponds to the second capacitor of the present invention.

One end of the capacitor 13 is connected to the output of the inductor 11 and to the input of the inductor 12. The other end of the capacitor 13 is connected to the ground via the inductor 6. The capacitor 13 corresponds to the third capacitor of the present invention, and the inductor 6 corresponds to the third inductor of the present invention.

One end of the capacitor 14 is connected to the input of the inductor 11. The other end of the capacitor 14 is connected to the ground via the inductor 7. The capacitor 14 corresponds to the fourth capacitor of the present invention, and the inductor 7 corresponds to the fourth inductor of the present invention.

One end of the capacitor 15 is connected to the output of the inductor 12. The other end of the capacitor 15 is connected to the ground via the inductor 8. The capacitor 15 corresponds to the fifth capacitor of the present invention, and the inductor 8 corresponds to the fifth inductor of the present invention. The inductors 6, 7 and 8 have different inductances.

The layered low-pass filter 1 has a circuit configuration of a fifth-order inverse Chebyshev or fifth-order elliptic low-pass filter. In the layered low-pass filter 1, when signals are received at the input terminal 2, those at frequencies equal to or lower than a specific cut-off frequency selectively pass through the layered low-pass filter 1 and are outputted from the output terminal 3: This layered low-pass filter 1 exhibits four attenuation poles in the stop band.

Figure 1:
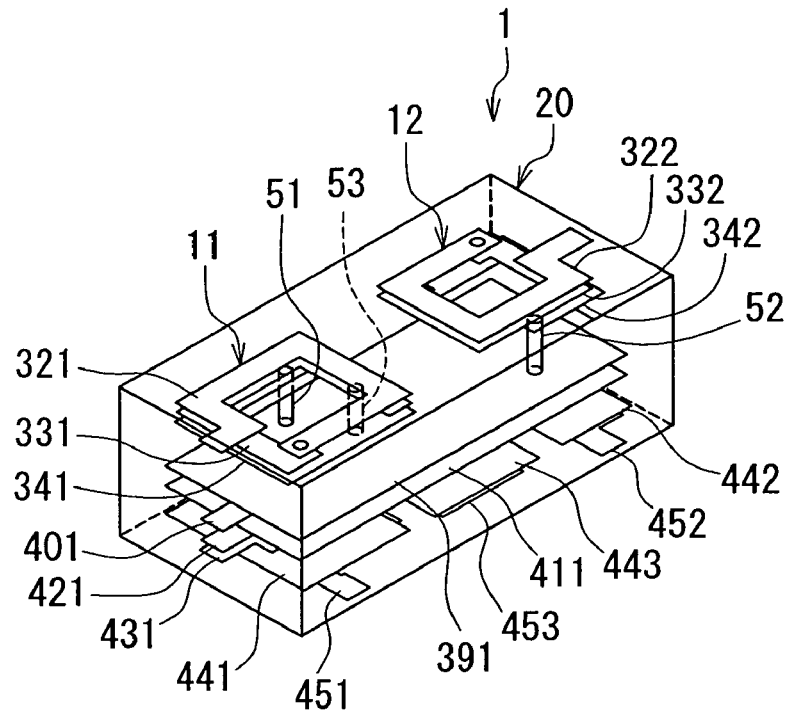
FIG. 1 is a perspective view illustrating the main part of a layered low-pass filter according to an embodiment of the invention.
Figure 2:
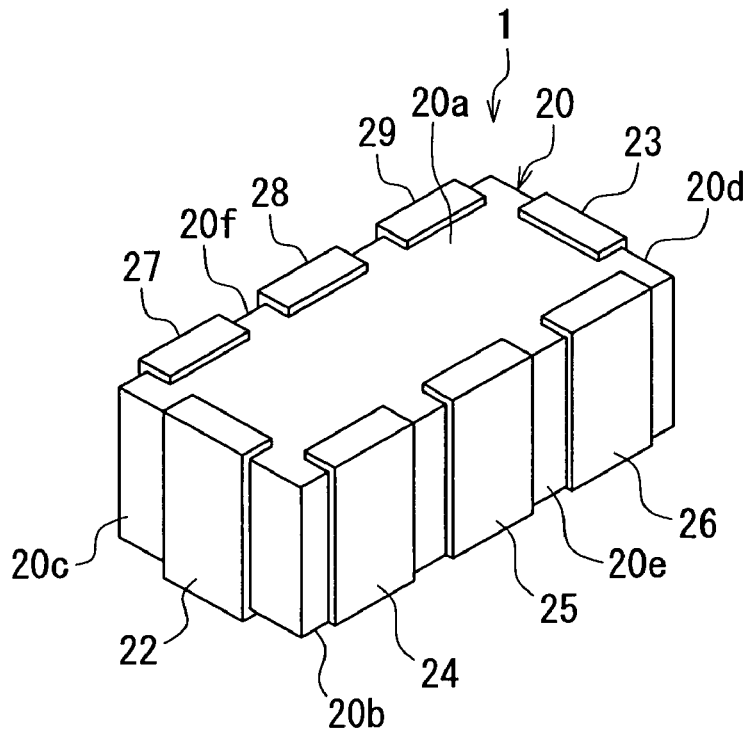
FIG. 2 is a perspective view illustrating the outer appearance of the layered low-pass filter according to the embodiment of the invention.

Reference is now made to FIG. 1 and FIG. 2 to describe an outline of the structure of the layered low-pass filter 1. FIG. 1 is a perspective view illustrating the main part of the layered low-pass filter 1. FIG. 2 is a perspective view illustrating the outer appearance of the layered low-pass filter 1.

The layered low-pass filter 1 has a layered substrate 20 for integrating the components of the layered low-pass filter 1. The layered substrate 20 includes a plurality of dielectric layers and a plurality of conductor layers stacked, which will be described in more detail later. Each of the inductors 6, 7, 8, 11 and 12 is provided within the layered substrate 20, being formed using at least one of the conductor layers located within the layered substrate 20. Each of the capacitors 13 to 17 is provided within the layered substrate 20, being formed using at least two of the conductor layers located within the layered substrate 20 and a dielectric layer located between the those conductor layers.

As illustrated in FIG. 2, the layered substrate 20 is rectangular-solid-shaped, having a top surface 20a, a bottom surface 20b and side surfaces 20c, 20d, 20e and 20f, as the periphery. The layered low-pass filter 1 has: an input terminal 22 disposed on the side surface 20c; an output terminal 23 disposed on the side surface 20d opposite to the side surface 20c; grounding terminals 24 and 26 and a terminal 25 disposed on the side surface 20e; and a grounding terminal 28 and terminals 27 and 29 disposed on the side surface 20f opposite to the side surface 20e. The terminal 25 is disposed between the grounding terminals 24 and 26. The terminals 27 and 29 are disposed on both sides of the grounding terminal 28. The input terminal 22 corresponds to the input terminal 2 of FIG. 3, and the output terminal 23 corresponds to the output terminal 3 of FIG. 3. The grounding terminals 24, 26 and 28 are connected to the ground. The terminals 25, 27 and 29 are terminals not connected to the circuit shown in FIG. 3. The grounding terminal 28 corresponds to the first grounding terminal of the present invention. The grounding terminal 24 corresponds to the second grounding terminal of the present invention. The grounding terminal 26 corresponds to the third grounding terminal of the present invention.

Figure 4A:
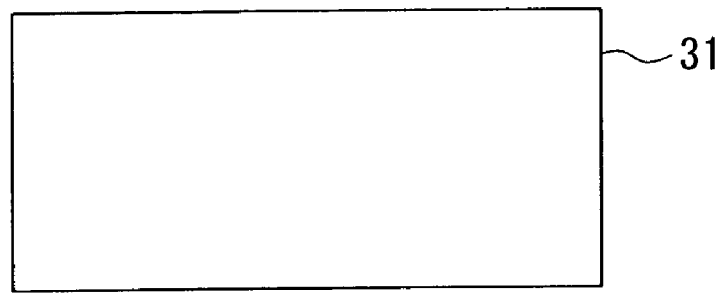
FIG. 4A to FIG. 4C illustrate the top surfaces of first to third dielectric layers of the layered substrate of the embodiment of the invention.
Figure 4B:
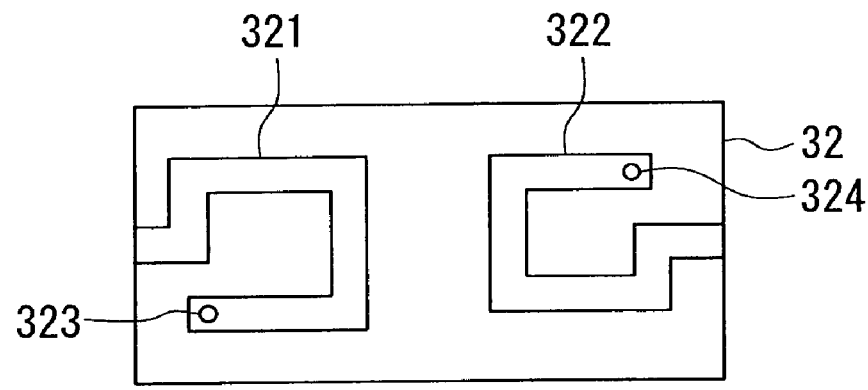
Figure 6A:
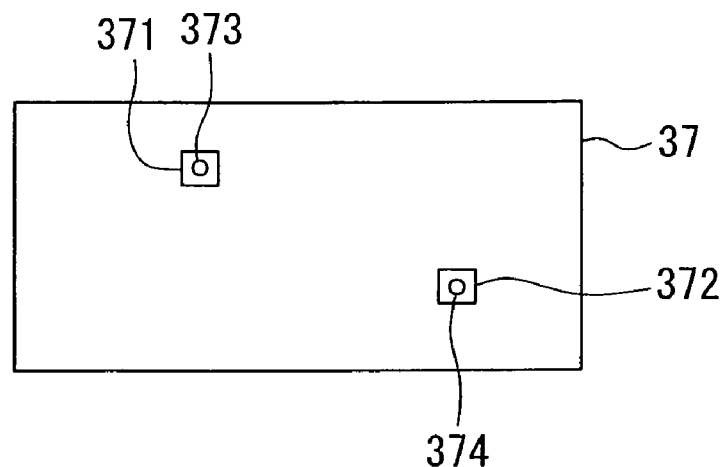
FIG. 6A to FIG. 6C illustrate the top surfaces of seventh to ninth dielectric layers of the layered substrate of the embodiment of the invention.
Figure 6B:
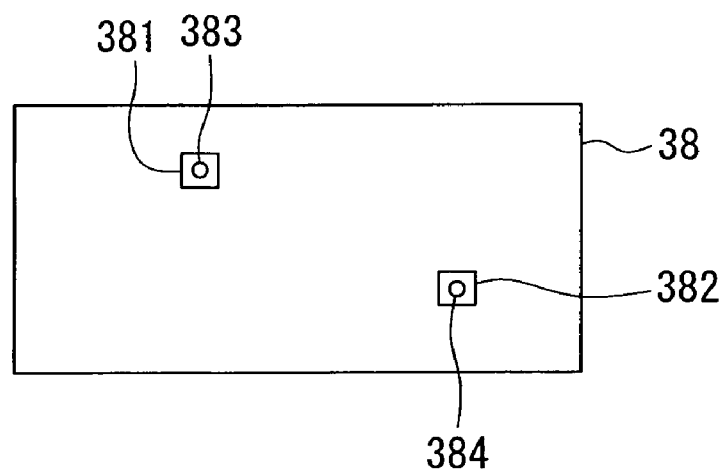
Figure 6C:
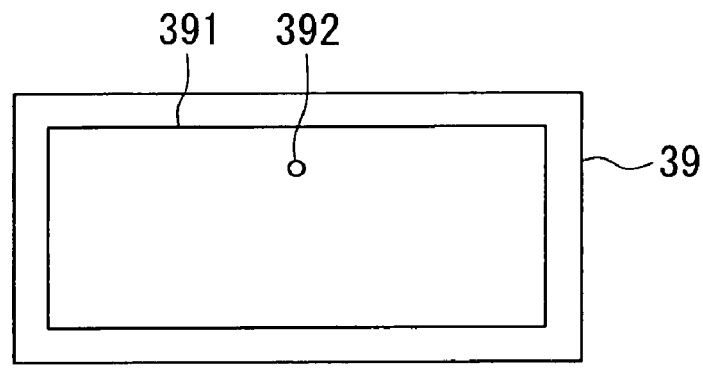
Figure 7A:
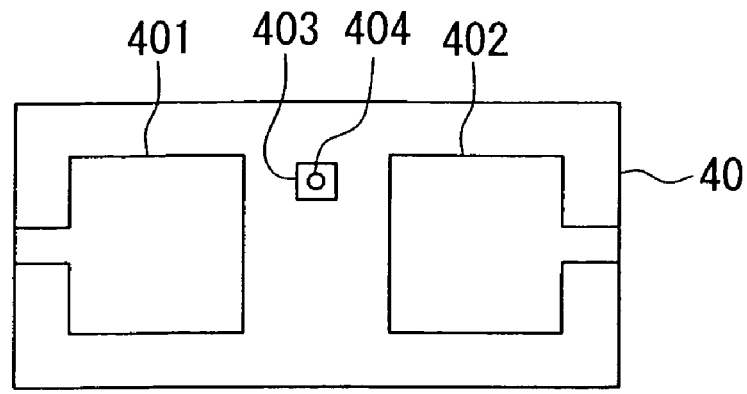
FIG. 7A to FIG. 7C illustrate the top surfaces of tenth to twelfth dielectric layers of the layered substrate of the embodiment of the invention.
Figure 7B:
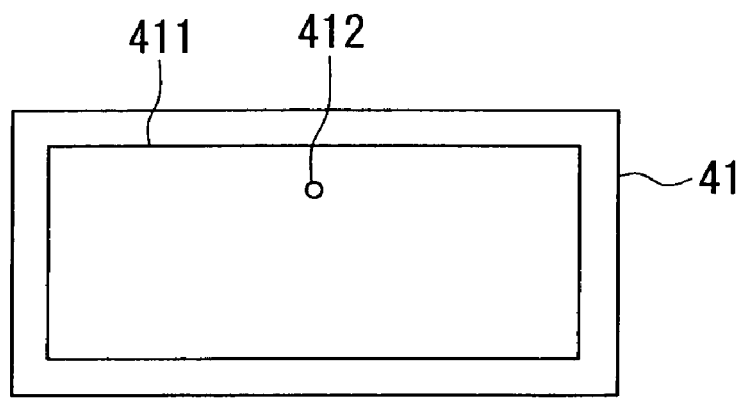
Figure 7C:
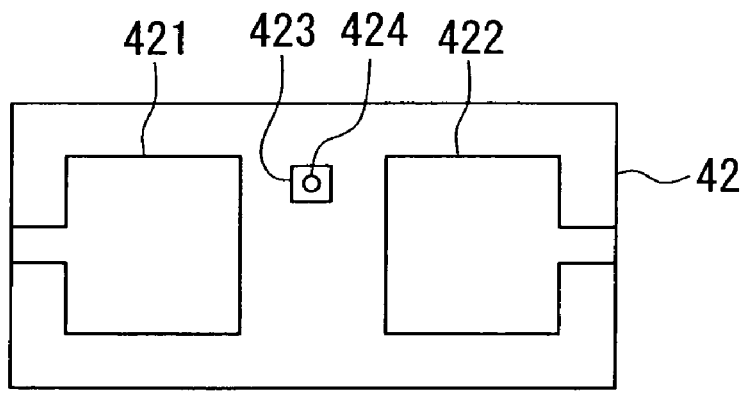
Figure 8A:
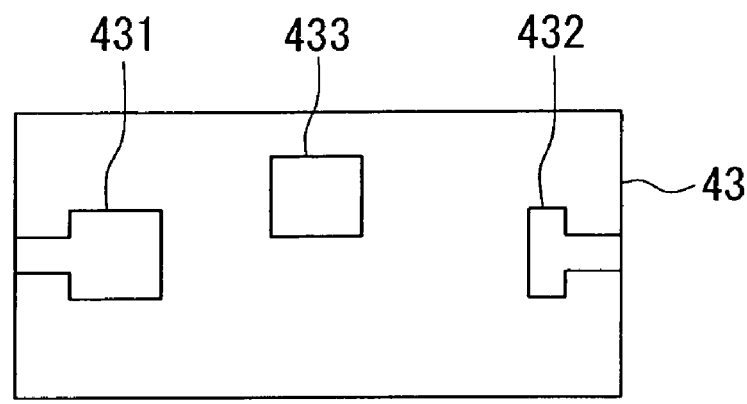
FIG. 8A to FIG. 8C illustrate the top surfaces of thirteenth to fifteenth dielectric layers of the layered substrate of the embodiment of the invention.
Figure 8B:
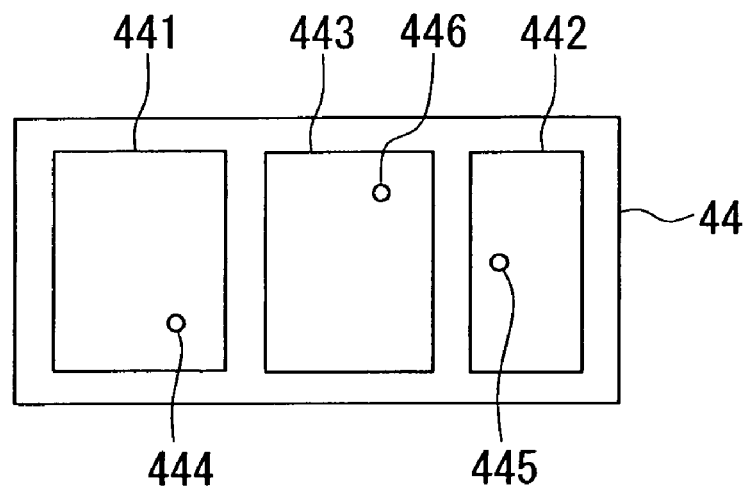
Figure 8C:
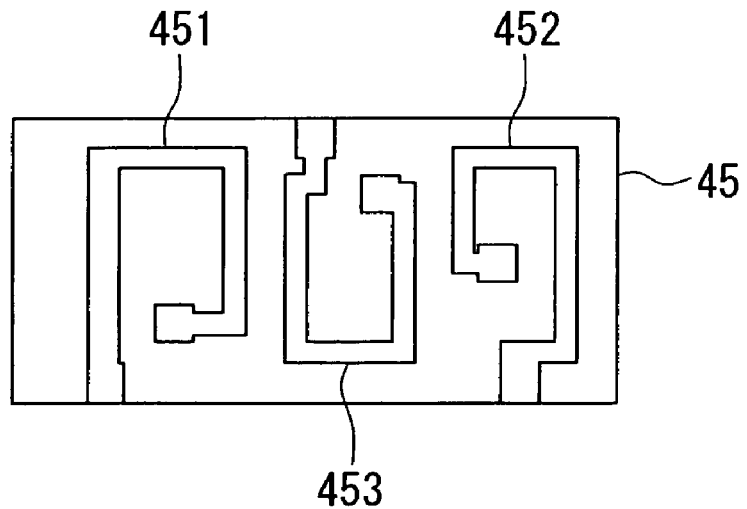

Reference is now made of FIG. 4A to FIG. 8C to describe the dielectric layers and the conductor layers of the layered substrate 20 in detail. FIG. 4A to FIG. 4C respectively illustrate the top surfaces of the first to third dielectric layers from the top. FIG. 5A to FIG. 5C respectively illustrate the top surfaces of the fourth to sixth dielectric layers from the top. FIG. 6A to FIG. 6C respectively illustrate the top surfaces of the seventh to ninth dielectric layers from the top. FIG. 7A to FIG. 7C respectively illustrate the top surfaces of the tenth to twelfth dielectric layers from the top. FIG. 8A to FIG. 8C respectively illustrate the top surfaces of the thirteenth to fifteenth dielectric layers from the top.

No conductor layer is formed on the top surface of the first dielectric layer 31 of FIG. 4A. Inductor-forming conductor layers 321 and 322 are formed on the top surface of the second dielectric layer 32 of FIG. 4B. One end of the conductor layer 321 is connected to the input terminal 22. This end of the conductor layer 321 forms the input of the inductor 11. The conductor layer 321 extends in such a manner as to rotate in a clockwise direction from the one end toward the other end as seen from above. One end of the conductor layer 322 is connected to the output terminal 23. This end of the conductor layer 322 forms the output of the inductor 12. The conductor layer 322 extends in such a manner as to rotate in a clockwise direction from the one end toward the other end as seen from above.

The dielectric layer 32 has a through hole 323 connected to a portion of the conductor layer 321 near the other end thereof, and a through hole 324 connected to a portion of the conductor layer 322 near the other end thereof.

Figure 4C:
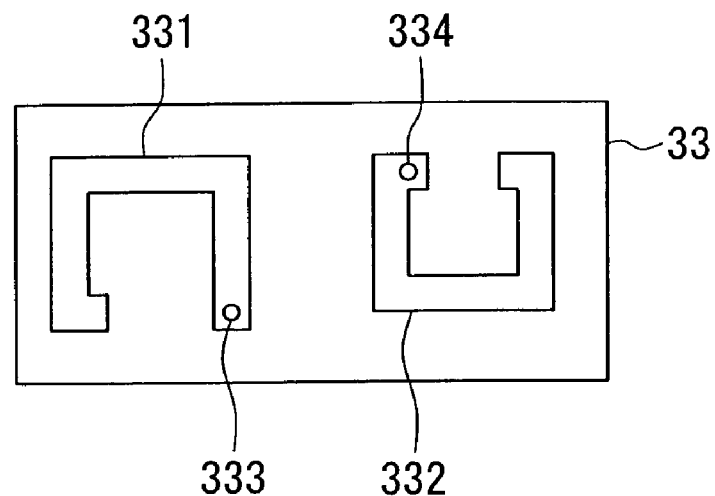

Inductor-forming conductor layers 331 and 332 are formed on the top surface of the third dielectric layer 33 of FIG. 4C. The through hole 323 is connected to a portion of the conductor layer 331 near one end thereof. The conductor layer 331 extends in such a manner as to rotate in a clockwise direction from the one end toward the other end as seen from above. The through hole 324 is connected to a portion of the conductor layer 332 near one end thereof. The conductor layer 332 extends in such a manner as to rotate in a clockwise direction from the one end toward the other end as seen from above.

The dielectric layer 33 has a through hole 333 connected to a portion of the conductor layer 331 near the other end thereof, and a through hole 334 connected to a portion of the conductor layer 332 near the other end thereof.

Figure 5A:
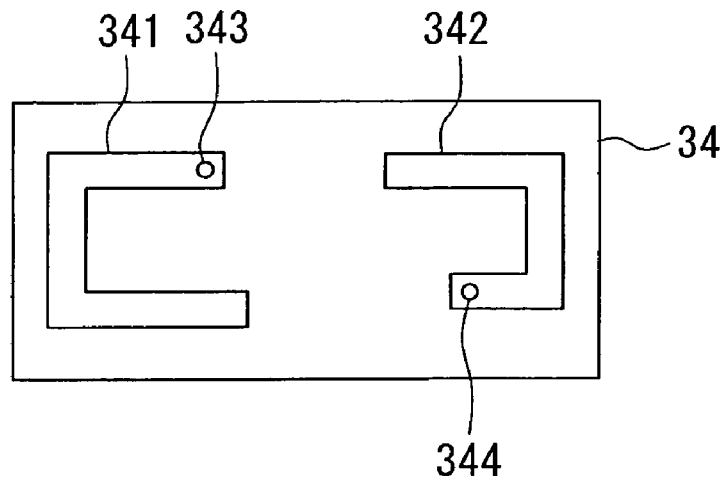
FIG. 5A to FIG. 5C illustrate the top surfaces of fourth to sixth dielectric layers of the layered substrate of the embodiment of the invention.

Inductor-forming conductor layers 341 and 342 are formed on the top surface of the fourth dielectric layer 34 of FIG. 5A. The through hole 333 is connected to a portion of the conductor layer 341 near one end thereof. The conductor layer 341 extends in such a manner as to rotate in a clockwise direction from the one end toward the other end as seen from above. The through hole 334 is connected to a portion of the conductor layer 342 near one end thereof. The conductor layer 342 extends in such a manner as to rotate in a clockwise direction from the one end toward the other end as seen from above.

The dielectric layer 34 has a through hole 343 connected to a portion of the conductor layer 341 near the other end thereof, and a through hole 344 connected to a portion of the conductor layer 342 near the other end thereof. The portion of the conductor layer 341 connected to the through hole 343 forms the output of the inductor 11. The portion of the conductor layer 342 connected to the through hole 344 forms the input of the inductor 12.

The inductor 11 is formed using the conductor layers 321, 331 and 341 and the through holes 323 and 333. The inductor 11 extends in such a manner as to rotate in a clockwise direction from the input toward the output as seen from above. The inductor 12 is formed using the conductor layers 322, 332 and 342 and the through holes 324 and 334. The inductor 12 extends in such a manner as to rotate in a counterclockwise direction from the input toward the output as seen from above.

Figure 5B:
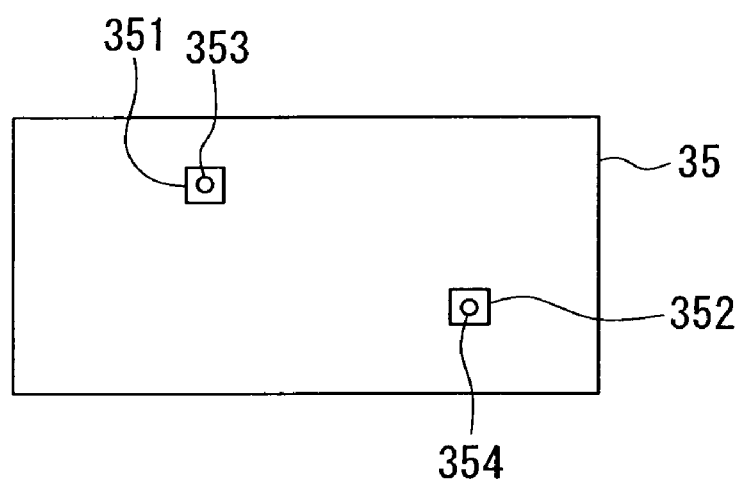

Conductor layers 351 and 352 are formed on the top surface of the fifth dielectric layer 35 of FIG. 5B. The dielectric layer 35 has a through hole 353 connected to the conductor layer 351, and a through hole 354 connected to the conductor layer 352. The through holes 353 and 354 are connected to the through holes 343 and 344, respectively.

Figure 5C:
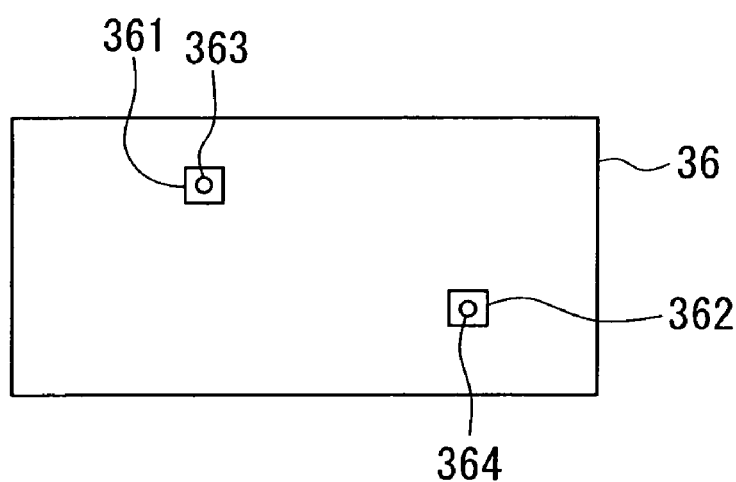

Conductor layers 361 and 362 are formed on the top surface of the sixth dielectric layer 36 of FIG. 5C. The dielectric layer 36 has a through hole 363 connected to the conductor layer 361, and a through hole 364 connected to the conductor layer 362. The through holes 363 and 364 are connected to the through holes 353 and 354, respectively.

Conductor layers 371 and 372 are formed on the top surface of the seventh dielectric layer 37 of FIG. 6A. The dielectric layer 37 has a through hole 373 connected to the conductor layer 371, and a through hole 374 connected to the conductor layer 372. The through holes 373 and 374 are connected to the through holes 363 and 364, respectively.

Conductor layers 381 and 382 are formed on the top surface of the eighth dielectric layer 38 of FIG. 6B. The dielectric layer 38 has a through hole 383 connected to the conductor layer 381, and a through hole 384 connected to the conductor layer 382. The through holes 383 and 384 are connected to the through holes 373 and 374, respectively.

A capacitor-forming conductor layer 391 is formed on the top surface of the ninth dielectric layer 39 of FIG. 6C. The through holes 383 and 384 are connected to the conductor layer 391. The dielectric layer 39 has a through hole 392 connected to the conductor layer 391.

Capacitor-forming conductor layers 401 and 402 and a conductor layer 403 are formed on the top surface of the tenth dielectric layer 40 of FIG. 7A. The conductor layer 401 is connected to the input terminal 22. The conductor layer 402 is connected to the output terminal 23. The dielectric layer 40 has a through hole 404 connected to the conductor layer 403. The through hole 404 is connected to the through hole 392.

A capacitor-forming conductor layer 411 is formed on the top surface of the eleventh dielectric layer 41 of FIG. 7B. The dielectric layer 41 has a through hole 412 connected to the through hole 404 and to the conductor layer 411.

Capacitor-forming conductor layers 421 and 422 and a conductor layer 423 are formed on the top surface of the twelfth dielectric layer 42 of FIG. 7C. The conductor layer 421 is connected to the input terminal 22. The conductor layer 422 is connected to the output terminal 23. The dielectric layer 42 has a through hole 424 connected to the conductor layer 423. The through hole 424 is connected to the through hole 412.

Capacitor-forming conductor layers 431, 432 and 433 are formed on the top surface of the thirteenth dielectric layer 43 of FIG. 8A. The conductor layer 431 is connected to the input terminal 22. The conductor layer 432 is connected to the output terminal 23. The through hole 424 is connected to the conductor layer 433.

Ground-side conductor layers 441, 442 and 443 are formed on the top surface of the fourteenth dielectric layer 44 of FIG. 8B. The dielectric layer 44 has a through hole 444 connected to the conductor layer 441, a through hole 445 connected to the conductor layer 442, and a through hole 446 connected to the conductor layer 443.

Inductor-forming conductor layers 451, 452 and 453 are formed on the top surface of the fifteenth dielectric layer 45 of FIG. 8C. The through hole 444 is connected to a portion of the conductor layer 451 near one end thereof. The other end of the conductor layer 451 is connected to the grounding terminal 24. The conductor layer 451 extends in such a manner as to rotate in a counterclockwise direction from the one end toward the other end as seen from above. The through hole 445 is connected to a portion of the conductor layer 452 near one end thereof. The other end of the conductor layer 452 is connected to the grounding terminal 26. The conductor layer 452 extends in such a manner as to rotate in a clockwise direction from the one end toward the other end as seen from above. The through hole 446 is connected to a portion of the conductor layer 453 near one end thereof. The other end of the conductor layer 453 is connected to the grounding terminal 28. The conductor layer 453 extends in such a manner as to rotate in a clockwise direction from the one end toward the other end as seen from above. The inductor 6 is formed of the inductor-forming conductor layer 453. The inductor 7 is formed of the inductor-forming conductor layer 451. The inductor 8 is formed of the inductor-forming conductor layer 452.

The first to fifteenth dielectric layers 31 to 45 and the conductor layers described above are stacked to form the layered substrate 20 illustrated in FIG. 1 and FIG. 2. The terminals 22 to 29 of FIG. 2 are each formed on the periphery of the layered substrate 20.

In this embodiment, various types of substrates can be employed as the layered substrate 20, such as one in which the dielectric layers are made of resin, ceramic, or a resin-ceramic composite material. However, a low-temperature co-fired ceramic multilayer substrate, which is excellent in high frequency response, is particularly preferable as the layered substrate 20.

The internal structure of the layered substrate 20 will now be further described with reference to FIG. 1 also. As mentioned previously, the inductor 11 is formed using the conductor layers 321, 331 and 341 and the through holes 323 and 333. The inductor 12 is formed using the conductor layers 322, 332 and 342 and the through holes 324 and 334. The through holes 343, 353, 363, 373 and 383 constitute a conducting path 51 shown in FIG. 1. The conducting path 51 connects the output of the inductor 11 and the conductor layer 391 to each other. The through holes 344, 354, 364, 374 and 384 constitute a conducting path 52 shown in FIG. 1. The conducting path 52 connects the input of the inductor 12 and the conductor layer 391 to each other.

The conductor layer 401 is opposed to the conductor layer 391 with the dielectric layer 39 located in between, and is also opposed to the conductor layer 411 with the dielectric layer 40 located in between. The conductor layer 421 is opposed to the conductor layer 411 with the dielectric layer 41 located in between. The conductor layers 391, 401, 411 and 421 and the dielectric layers 39, 40 and 41 constitute the capacitor 16 of FIG. 3.

The conductor layer 402 is opposed to the conductor layer 391 with the dielectric layer 39 located in between, and is also opposed to the conductor layer 411 with the dielectric layer 40 located in between. The conductor layer 422 is opposed to the conductor layer 411 with the dielectric layer 41 located in between. The conductor layers 391, 402, 411 and 422 and the dielectric layers 39, 40 and 41 constitute the capacitor 17 of FIG. 3.

The through holes 392, 404, 412 and 424 constitute a conducting path 53 shown in FIG. 1. The conducting path 53 connects the conductor layers 391 and 433 to each other. The conductor layer 433 is opposed to the conductor layer 443 with the dielectric layer 43 located in between. The capacitor 13 of FIG. 3 is formed of the conductor layers 433 and 443 opposed to each other and the dielectric layer 43 located between them.

The conductor layer 431 is connected to the one end of the inductor-forming conductor layer 321 via the input terminal 22. The conductor layer 431 is opposed to the conductor layer 441 with the dielectric layer 43 located in between. The capacitor 14 of FIG. 3 is formed of the conductor layers 431 and 441 opposed to each other and the dielectric layer 43 located between them.

The conductor layer 432 is connected to the one end of the inductor-forming conductor layer 322 via the output terminal 23. The conductor layer 432 is opposed to the conductor layer 442 with the dielectric layer 43 located in between. The capacitor 15 of FIG. 3 is formed of the conductor layers 432 and 442 opposed to each other and the dielectric layer 43 located between them.

As mentioned previously, the inductors 6, 7 and 8 are formed of the inductor-forming conductor layers 453, 451 and 452, respectively.

Figure 9:
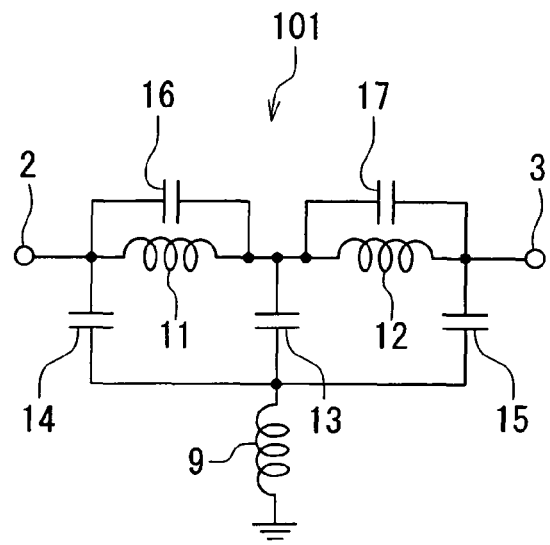
FIG. 9 is a circuit diagram illustrating the circuit configuration of a layered low-pass filter of a comparative example.

The functions and effects of the layered low-pass filter 1 according to the present embodiment will now be described in comparison with a layered low-pass filter 101 of a comparative example. First, a description will be given of the circuit configuration of the layered low-pass filter 101 of the comparative example with reference to FIG. 9. As illustrated in FIG. 9, the layered low-pass filter 101 of the comparative example has a single inductor 9 instead of the inductors 6, 7 and 8 of the layered low-pass filter 1 according to the present embodiment. In this comparative example, the other end of each of the capacitors 13, 14 and 15 is connected to one end of the inductor 9. The other end of the inductor 9 is connected to the ground.

Figure 10:
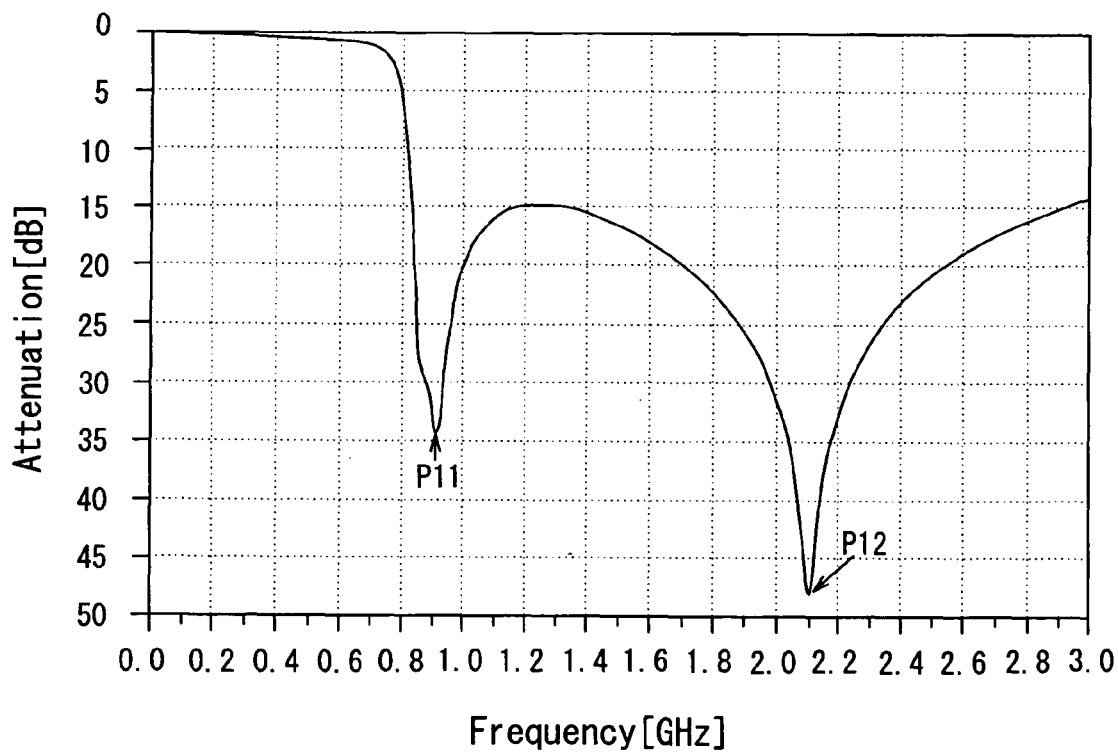
FIG. 10 is a plot illustrating the pass attenuation characteristic of the layered low-pass filter of the comparative example.
Figure 11:
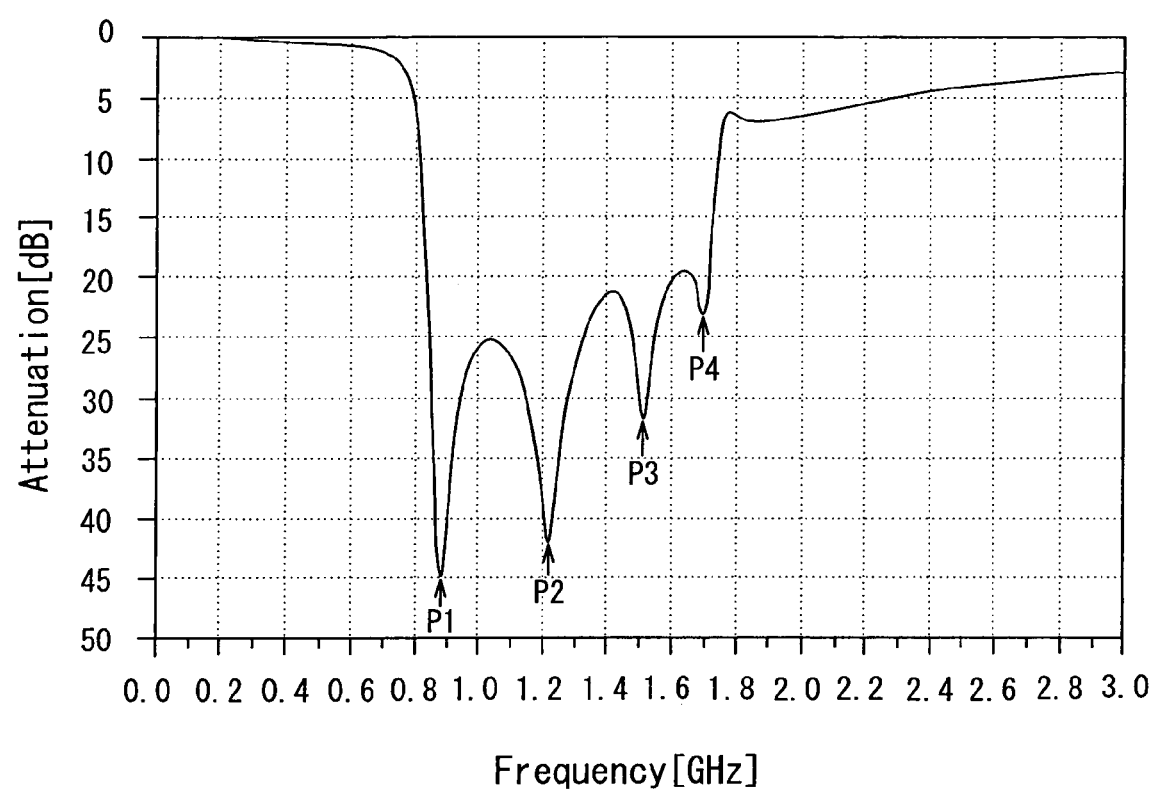
FIG. 11 is a plot illustrating the pass attenuation characteristic of the layered low-pass filter according to the embodiment of the invention.

A description will now be made on the results of comparison between the pass attenuation characteristic of the layered low-pass filter 1 according to the present embodiment and that of the layered low-pass filter 101 of the comparative example by simulation. FIG. 10 shows the pass attenuation characteristic of the layered low-pass filter 101 of the comparative example. FIG. 11 shows the pass attenuation characteristic of the layered low-pass filter 1 according to the present embodiment. In FIG. 10 and FIG. 11 the horizontal axis represents frequency, while the vertical axis represents attenuation. The pass attenuation characteristics shown in FIG. 10 and FIG. 11 were obtained by simulation.

As shown in FIG. 10, in the pass attenuation characteristic of the layered low-pass filter 101 of the comparative example, a first attenuation pole P11 and a second attenuation pole P12 appear in the stop band. The frequency at which the second attenuation pole P12 appears is higher than the frequency at which the first attenuation pole P11 appears. The frequency at which the second attenuation pole P12 appears depends on the inductance of the inductor 9.

As shown in FIG. 11, in the pass attenuation characteristic of the layered low-pass filter 1 according to the present embodiment, a first attenuation pole P1, a second attenuation pole P2, a third attenuation pole P3 and a fourth attenuation pole P4 appear in the stop band. The frequencies at which the second, third and fourth attenuation poles P2, P3 and P4 appear are each higher than the frequency at which the first attenuation pole P1 appears. The second, third and fourth attenuation poles P2, P3 and P4 result from the inductors 6, 7 and 8 having different inductances. The frequency at which the second attenuation pole P2 appears depends on the inductance of the inductor 6. The frequency at which the third attenuation pole P3 appears depends on the inductance of the inductor 7. The frequency at which the fourth attenuation pole P4 appears depends on the inductance of the inductor 8. In the example shown in FIG. 11, the frequency at which the third attenuation pole P3 appears is higher than the frequency at which the second attenuation pole P2 appears, and the frequency at which the fourth attenuation pole P4 appears is higher than the frequency at which the third attenuation pole P3 appears.

In the case where it is required to increase attenuation especially in a plurality of specific narrow frequency bands present in the stop band of a low-pass filter that exhibits at least a first attenuation pole in its pass attenuation characteristic in a signal path in which the low-pass filter is used, the plurality of specific narrow frequency bands are typically present within a range from the frequency at which the first attenuation pole appears to a frequency on the order of several times higher than the cut-off frequency. According to the comparative example, it is possible to increase attenuation especially in one specific narrow frequency band present in the stop band of the low-pass filter 101 by utilizing the second attenuation pole P12, but it is not possible to increase attenuation especially in all of a plurality of specific narrow frequency bands present in the stop band of the layered low-pass filter 101.

In contrast, the present embodiment is capable of providing the second, third and fourth attenuation poles P2, P3 and P4 within the range from the frequency at which the first attenuation pole P1 appears to a frequency on the order of several times higher than the cut-off frequency. Furthermore, according to the present embodiment, it is possible to adjust the frequencies at which the second, third and fourth attenuation poles P2, P3 and P4 appear by adjusting the inductances of the inductors 6, 7 and 8, respectively. Consequently, according to the present embodiment, it is possible to increase attenuation especially in a plurality of specific narrow frequency bands present in the stop band of the layered low-pass filter 1 by utilizing the second, third and fourth attenuation poles P2, P3 and P4, without providing a plurality of notch filters in series to the layered low-pass filter 1.

According to the present embodiment, the capacitor 13 includes the capacitor-forming conductor layer 433 and the ground-side conductor layer 443 opposed to each other with the dielectric layer 43 located in between. The capacitor 14 includes the capacitor-forming conductor layer 431 and the ground-side conductor layer 441 opposed to each other with the dielectric layer 43 located in between. The capacitor 15 includes the capacitor-forming conductor layer 432 and the ground-side conductor layer 442 opposed to each other with the dielectric layer 43 located in between. The inductor 6 formed of the inductor-forming conductor layer 453 connects the ground-side conductor layer 443 of the capacitor 13 to the grounding terminal 28. The inductor 7 formed of the inductor-forming conductor layer 451 connects the ground-side conductor layer 441 of the capacitor 14 to the grounding terminal 24. The inductor 8 formed of the inductor-forming conductor layer 452 connects the ground-side conductor layer 442 of the capacitor 15 to the grounding terminal 26. According to the present embodiment, the ground-side conductor layers 441, 442 and 443 are disposed on a surface of one of the dielectric layers, i.e., the dielectric layer 44, and the inductors 6, 7 and 8 (the inductor-forming conductor layers 453, 451 and 452) are disposed on a surface of another one of the dielectric layers, i.e., the dielectric layer 45. Consequently, according to the present embodiment, it is possible to provide the inductors 6, 7 and 8 within the layered substrate 20 while preventing an increase in size of the layered low-pass filter 1.

The present invention is not limited to the foregoing embodiment but can be carried out in various modifications. For example, the layered low-pass filter of the present invention may include three or more inductors connected in series and located between the input terminal and output terminal in terms of circuit configuration. In this case, a capacitor and an inductor connected in series can be provided at each of: a location between the ground and the input of one of the inductors that is located closest to the input terminal in terms of circuit configuration; a location between the ground and the output of another one of the inductors that is located closest to the output terminal in terms of circuit configuration; and a location between the ground and a node between every adjacent two inductors. According to the present invention, it is possible to provide attenuation poles, other than the first attenuation pole, as many as the number of inductors connected to the ground.

The layered low-pass filter of the present invention is useful as a low-pass filter for use in reception devices for one-segment broadcasts, for example.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:
1. A layered low-pass filter comprising:
a layered substrate including a plurality of dielectric layers stacked;
an input terminal and an output terminal each disposed on a periphery of the layered substrate;
a first inductor and a second inductor each formed using at least one conductor layer provided within the layered substrate, the first and second inductors being connected in series to each other and, in terms of circuit configuration, located between the input terminal and the output terminal;
first to fifth capacitors and third to fifth inductors provided within the layered substrate; and
first to third grounding terminals each disposed on the periphery of the layered substrate and connected to a ground, wherein:
in terms of circuit configuration, the first inductor is located closer to the input terminal than is the second inductor;
each of the first and second inductors has an input for receiving signals and an output for outputting signals;
the output of the first inductor is connected to the input of the second inductor;
the first capacitor is connected in parallel to the first inductor;
the second capacitor is connected in parallel to the second inductor;
the third capacitor has a first end connected to the output of the first inductor and to the input of the second inductor;
the fourth capacitor has a first end connected to the input of the first inductor;

the fifth capacitor has a first end connected to the output of the second inductor;

the third inductor connects a second end of the third capacitor to the ground;

the fourth inductor connects a second end of the fourth capacitor to the ground;

the fifth inductor connects a second end of the fifth capacitor to the ground;

each of the third to fifth capacitors includes a capacitor-forming conductor layer and a ground-side conductor layer that are opposed to each other;

the third inductor connects the ground-side conductor layer of the third capacitor to the first grounding terminal;

the fourth inductor connects the ground-side conductor layer of the fourth capacitor to the second grounding terminal;

the fifth inductor connects the ground-side conductor layer of the fifth capacitor to the third grounding terminal;

the ground-side conductor layers of the third to fifth capacitors are disposed on a surface of one of the dielectric layers; and the third to fifth inductors are disposed on a surface of another one of the dielectric layers.

* * * * *